United States Patent [19]

Dobrovolny

[11] Patent Number: 4,523,159
[45] Date of Patent: Jun. 11, 1985

[54] MICROWAVE OSCILLATOR AND SINGLE BALANCED MIXER FOR SATELLITE TELEVISION RECEIVER

[75] Inventor: Pierre Dobrovolny, North Riverside, Ill.

[73] Assignee: Zenith Electronics Corporation, Glenview, Ill.

[21] Appl. No.: 566,237

[22] Filed: Dec. 28, 1983

[51] Int. Cl.³ .......................... H03B 5/18; H04B 1/28
[52] U.S. Cl. ................................. 331/99; 331/117 D; 333/247; 455/319; 455/327; 455/330
[58] Field of Search ........ 331/96, 99, 117 D, 117 FE, 331/107 SL; 455/318, 319, 325, 326, 327, 330; 333/247, 250

[56] References Cited

U.S. PATENT DOCUMENTS

| | | | |
|---|---|---|---|
| 4,219,779 | 8/1980 | Shinkawa et al. | 455/321 X |
| 4,293,956 | 10/1981 | Altstatt | 455/327 |
| 4,357,582 | 11/1982 | Ishihara et al. | 331/96 |
| 4,445,097 | 4/1984 | Godart et al. | 331/117 D |

Primary Examiner—Siegfried H. Grimm

[57] ABSTRACT

A microwave oscillator and a combination microwave oscillator/single balanced mixer for a satellite television receiver includes a cylindrical dielectric resonator located on one side of a ground plane formed by a conductive foil on a substrate with microstrip transmission lines formed by foil patterns on the opposite side of said substrate. A gallium arsenide FET is disposed in a hole through said substrate with its source electrode connected to the ground plane and its drain and gate electrodes coupled to first and second transmission line strips, portions of which are following the contours of said dielectric resonator. Two sets of coupling slots are formed in the ground plane for permitting magnetic coupling between the dielectric resonator and the opposite transmission line strips. In one embodiment an additional coupling slot in the ground plane couples the dielectric resonator to an output transmission line strip. In another embodiment a dual diode package is disposed in a square hole in the substrate and ground plane with the common junction of the two diodes being coupled to a third transmission line strip and the opposite ends of the series connected diodes coupled to the ground plane. Coupled magnetic energy from the resonator creates a potential difference across the ground plane at the opposite sides of the square hole thus generating a local oscillator signal across the series connected diodes. The third transmission line strip serves as a coupling for both an RF signal input to and an IF signal output from, the mixer.

10 Claims, 10 Drawing Figures

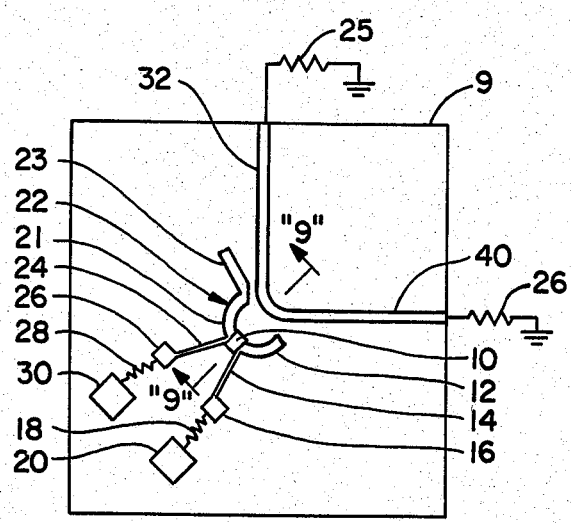
Fig. 1
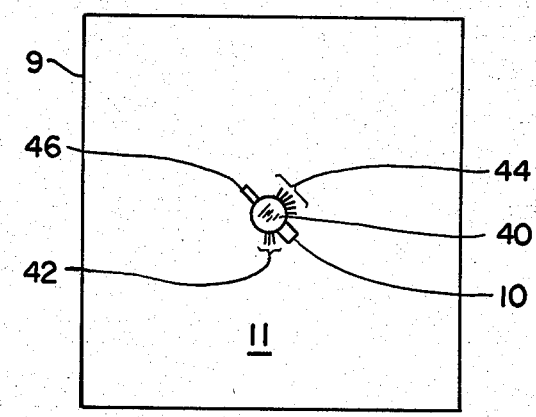
Fig. 2
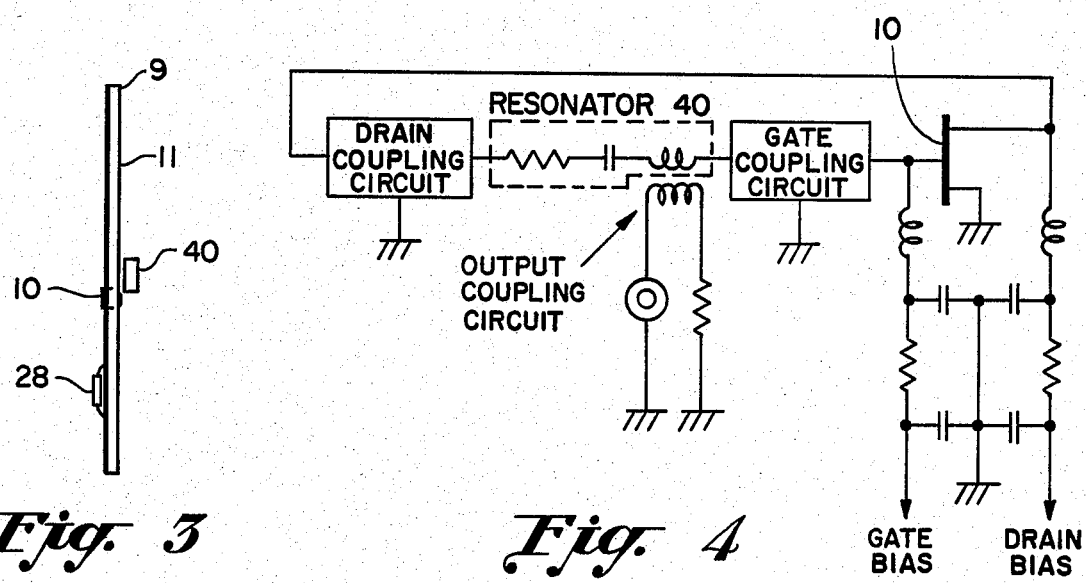
Fig. 3
Fig. 4

MICROWAVE OSCILLATOR AND SINGLE BALANCED MIXER FOR SATELLITE TELEVISION RECEIVER

BACKGROUND OF THE INVENTION AND PRIOR ART

This invention relates generally to high frequency RF receivers and particularly to a microwave oscillator and mixer arrangement for use in satellite television receiver circuits.

A radio frequency (RF) receiver generally includes an RF amplifier for amplifying a received signal and a form of frequency converter for translating the received signals to a more convenient lower frequency. The frequency converter generally includes a mixer circuit that is supplied with an RF signal and also coupled to a source of reference frequency from a local oscillator. The received RF signal is mixed or heterodyned with the signal from the reference oscillator to generate an intermediate frequency (IF) signal for further processing in the receiver. At higher frequencies in the RF spectrum, expensive hybrid microcircuits are frequently used. They generally include discrete active and passive components sometimes in combination with integrated circuit elements interconnected by means of microstrip conductors, which are short transmission lines.

In the co-pending application of the inventor entitled "Integrated Single Balanced Mixer/Oscillator with Slot and Hybrid Coupler", Ser. No. 456,158, filed Jan. 6, 1983, now U.S. Pat. No. 4,461,040, and assigned to Zenith Radio Corporation, a low cost oscillator/mixer arrangement for a microwave television receiver of approximately 12 gigaHertz for direct satellite reception that avoids many of the expensive fabrication techniques of the prior art is described. For example, in that application, the complex filter circuits for rejection of local oscillator and image frequencies and all critical and discrete, passive devices have been substantially simplified or eliminated.

This invention is an improvement over the oscillator arrangement described in the co-pending application; specifically in the form of coupling means for coupling the electromagnetic energy of the dielectric resonator, located on one side of the ground plane, to the mixer diodes and also to the transmission line strips connected to the electrodes of the oscillator transistor located on the other side of the ground plane.

OBJECTS OF THE INVENTION

Accordingly, it is the principal object of the invention to provide a novel high frequency oscillator.

Another object of the invention is to provide a novel microstrip coupled oscillator.

A further object of the invention is to provide a novel high frequency integrated oscillator/single balanced mixer arrangement.

A still further object of the invention is to provide a low cost high frequency integrated oscillator/mixer arrangement that is stable in operation and with a low level of oscillator phase noise.

A still further object of the invention is to provide a high frequency integrated oscillator/mixer arrangement without passive microwave chip components.

SUMMARY OF THE INVENTION

The invention comprises a high frequency oscillator including a printed circuit board, a ground plane on the bottom of the board and a dielectric resonator underlying the ground plane on the bottom of the board. Transistor means, disposed within a hole extending through the board, have a common electrode connected to the ground plane and input and output electrodes connected to transmission line strips formed on the top side of the board. A plurality of magnetic field coupling slots are formed in the ground plane for coupling the magnetic field developed by the dielectric resonator to the transmission line strips thereby closing the feedback loop.

BRIEF DESCRIPTION OF THE DRAWINGS

These and other objects and advantages of the invention will be apparent from reading the following description thereof in conjunction with the drawings in which:

FIG. 1 is a view of the top side of the printed circuit board of the inventive oscillator;

FIG. 2 is a view of the bottom side of the circuit board;

FIG. 3 is a side view of the circuit board;

FIG. 4 is an equivalent schematic diagram of the oscillator of the invention;

DESCRIPTION OF THE PREFERRED EMBODIMENT

Figure 5:
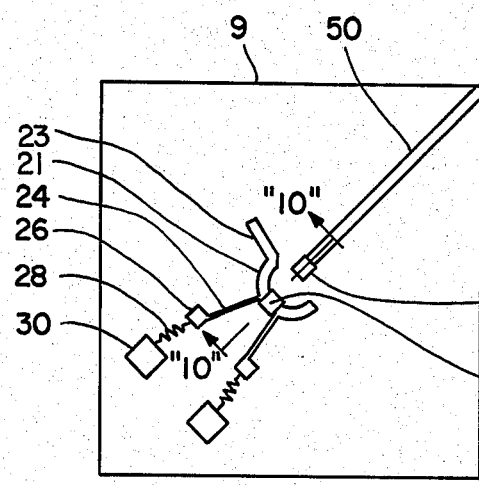
FIG. 5 is a top view of the circuit board of a combined oscillator/single balanced mixer constructed in accordance with the invention.

Referring to FIGS. 1, 2, and 3, a substrate includes a hole therethrough housing a gallium arsenide type field effect transistor 10. The board is preferably of double sided conductive foil construction on a high quality substrate of teflon or the like. While the outline is generally square shaped, it will be recognized that this is a simple matter of choice. The top side of the board is shown in FIG. 1, the bottom side in FIG. 2, and a side view is shown in FIG. 3. The conductive foil on the bottom of the board forms a ground plane 11 which is continuous with the exception of certain portions, to be described hereinafter, that are etched away to allow coupling of magnetic energy between the two sides of the printed circuit board. These etched away portions, in the form of "slots", provided a path for magnetic coupling fields between the two sides of the board.

The gate and drain electrodes of the gallium arsenide field effect transistor (FET) oscillator are coupled together by a feedback loop which contains a high-Q resonant circuit. In particular, the oscillator comprises a gallium arsenide FET transistor 10 disposed in a square hole extending through the printed circuit board. The transistor may be a Mitsubishi type MGF-1402 or a similar one which has the package bottom metalized and connected with the FET source electrode. The source electrode of the FET is directly soldered to ground plane 11 on the bottom of substrate 9. This connection insures that the source electrode is grounded with a minimum of inductance so that the resulting active two port device will either be or closely approach unconditional stability at all frequencies, in the absence of the resonant feedback element to be described.

The drain electrode of FET 10 is soldered to an annular transmission line strip 12 and its gate electrode is soldered to an annular section 21 of a transmission line strip 22, both transmission line strips 12 and 22 are formed on the top side of the printed circuit board. Transmission line strip 22 is also provided with an extension 23 for purposes to be described.

The drain electrode of FET 10 is coupled to a first capacitive pad 16 by a relatively narrow high impedance transmission line strip 14 having a length equal to a quarter wavelength. Capacitive pad 16 is coupled, through a discrete resistor 18, to a larger capacitive pad 20. Similarly, the gate electrode of FET 10 is coupled to a capacitive pad 26 by a narrow high impedance transmission line strip 24. Capacitive pad 26 is coupled to a larger capacitive pad 30 by a discrete resistor 28. Pads 16 and 26 serve to load one end of the ¼ wavelength lines so that the other ends will exhibit a very high RF impedance. Capacitive pads 20 and 30 serve to maximize the decoupling between the DC and RF sections of the oscillator. DC bias for the drain and gate electrodes of the FET are applied to capacitive pads 20 and 30. It will be appreciated that at lower frequencies, resistors 18 and 28 may also contribute to the unconditional stability of the active device. Both of the resistors may be conventional ⅛ watt carbon types with very short leads.

A cylindrical, high-Q dielectric resonator 40, in an empty cavity or shielding enclosure (not shown), to prevent resonator Q decrease caused by electromagnetic radiation, is positioned a predetermined distance below ground plane 11 on substrate 9. Those skilled in the art will appreciate that while the means for maintaining the resonator a predetermined distance from the ground plane in an empty cavity are not shown, such means are well-known. The resonator is concentrically located within the outer circumference defined by annular transmission line strip 12 and annular section 21 of transmission line strip 22. Disposed about the circumference of dielectric resonator 40 are a first series of magnetic field coupling slots 42 underlying transmission line strip 12, a second series of magnetic field coupling slots 44 underlying annular section 21 of transmission line strip 22 and a somewhat wider magnetic field coupling slot 46 underlying a point within the apex of a symmetrical output transmission line strip 32. As mentioned previously, slots 42, 44, and 46 are preferably formed by etching away small strips of the conductive foil of ground plane 11. The lateral dimensions of the slots should not be much greater than the width of the corresponding overlying transmission line strips. This, of course is for the purpose of minimizing resonator radiation leakage. The source electrode of the FET, which extends through the square hole in the substrate, is soldered to the ground plane at a point generally diametrically disposed from slot 46.

It will be appreciated that the two series of coupling slots need not contain more than one slot each, the invention not being concerned with the number of coupling slots used. Similarly, it should be understood that, while radially extending slots are shown, the slots, and the corresponding overlying transmission line strips, need not be configured in an arc. Other dispositions of lines and coupling slots are specifically contemplated in this invention.

Slots 42 couple the magnetic field developed by the dielectric resonator to annular transmission line strip 12 and thereby to the drain electrode of FET 10. Similarly, slots 44 couple the magnetic field developed by resonator 40 to annular section 21 of transmission line strip 22 and thereby to the gate electrode of the FET. This coupling arrangement forms an oscillator wherein the gate and drain electrodes of FET 10 are mutually coupled by a feedback loop containing a high-Q resonant circuit formed by dielectric resonator 40.

Slot 46 in the ground plane on the underside of the printed circuit board couples the magnetic field developed by the resonator to output transmission line strip 32. Transmission line strip 32 forms a symmetrical output wherein waves are propagated outwardly from the apex of the strip along its two arms. While the ends of the arms are shown coupled to ground through resistors 25 and 26 respectively, one of these arms may be terminated by a matched load (such as resistor 25) and the other arm may be used to provide the oscillator output. This, of course, results in only one-half of the output power of the oscillator being available at the local oscillator output terminal. Alternatively, a suitable microwave balun may be incorporated to couple all of the output oscillator power to the load.

Proper operation of the oscillator depicted requires termination of transmission line strip 22 with an inductive reactance. Extension 23 on transmission line strip 22 provides this inductive termination by extending the strip beyond coupling slots 44 at a distance greater than ¼ wavelength, but less than ½ wavelength, of the oscillator frequency. Conversely, the extension of annular transmission line strip 12 over coupling slots 42 is less than ¼ wavelength and is therefore capacitive. It should be understood that other oscillators with differing length of transmission line strips may be designed. The particular configuration shown is for an oscillator having a frequency of approximately 11 gigaHertz.

In the side view of FIG. 3, the extension of FET 10 into and through the substrate, as well as the arrangement of the dielectric resonator 40 on the opposite side of the ground plane are clearly shown.

FIG. 4 is an equivalent schematic of the oscillator in which resonator 40, depicted as a series arrangement of a resistor, a capacitor and an inductor, is inductively coupled to the output circuit and serially connected between the drain coupling circuit and the gate coupling circuit, which are respectively coupled to the drain and gate electrodes of FET transistor 10. The source electrode of the FET is grounded and operating bias is provided from gate and drain bias sources, through suitable RF decoupling circuits, to the gate and drain electrodes of FET 10.

Figure 6:
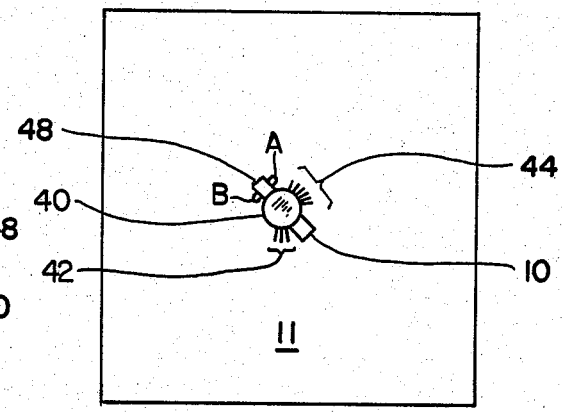
FIG. 6 is a bottom view of the circuit board of FIG. 5.

FIGS. 5 and 6 illustrate the combination of an oscillator, constructed in accordance with the invention, and a pair of mixer diodes closely integrated with the oscillator. The depicted mixer has been simplified to a mixer "core" containing just a diode pair package 48 and a transmission line strip 50. In an actual high performance mixer, one has also to provide image rejection, RF matching, IF matching, RF-IF decoupling circuitry, etc., which requires additional elements. Concentrating on the differences between FIGS. 5 and 6, and FIGS. 1 and 2, it is seen that rather than having a coupling slot for coupling energy to an output transmission line strip, a diode arrangement 48 is positioned in a square hole (the size of the hole determining the oscillator power delivered to the mixer diodes) extending through the substrate and ground plane in a manner similar to the mounting of FET 10. A common mixer RF signal input and IF signal output transmission line strip 50 is connected to the center terminal of the diode arrangement, as will be more fully described. Reference to FIG. 6 shows diode package 48 extending through and being coupled to the foil of the ground plane by terminals A and B. It will be appreciated by those skilled in the art that, because of the break in the ground plane created for diode package 48, magnetic energy from resonator 40 will induce an electrical field across the gap, thus creating a potential difference between terminals A and B of the mixer diode pair.

Figure 7:
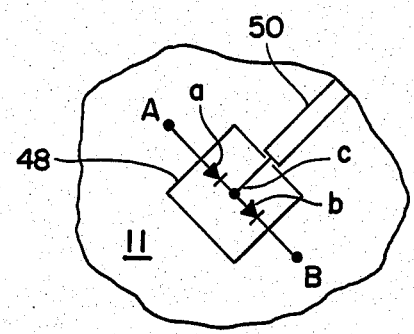
FIG. 7 is a schematic view showing the arrangement of the diodes in a mixer for use in conjunction with FIGS. 5 and 6.

FIG. 7 indicates a schematic diagram of diode arrangement 48 which includes a pair of series connected diodes a and b connected between terminals A and B. The junction of the diodes forms a terminal C which is connected to transmission line strip 50. It will be further appreciated that transmission line strip 50 can simultaneously carry the RF signal input to the mixer diodes and the IF signal output, and because of the balanced nature of the mixer, little of the oscillator power may leak out through line 50.

Figure 8:
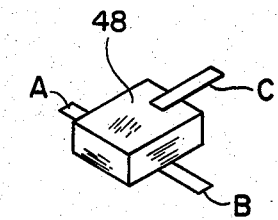
FIG. 8 is a view of a desirable diode package construction for use in the combined oscillator/mixer of FIGS. 5 and 6.

Reference to FIG. 8 reveals a convenient but as yet unavailable configuration for diode package 48 with terminals A and B extending from the bottom surface thereof and terminal C from the top surface. This configuration would conveniently enable diode package 48 to be positioned in an appropriately-sized square hole in the printed circuit board with terminals A, B being soldered to the ground plane and terminal C being soldered to the transmission line strip. The conventional dual diode package (for example DMD 6885A made by Alpha Industries) has all three terminal strips located on the same surface. In this case, conductive jumper strips have to be added between A and B and the respective portions of the ground plane 11 underneath terminals A and B.

Figure 9:
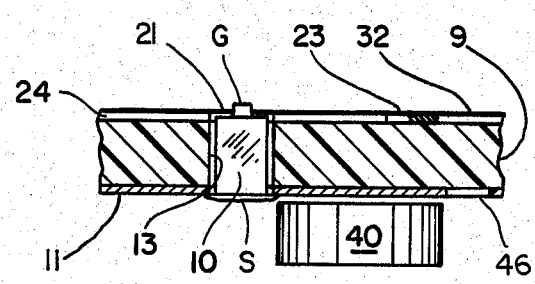
FIG. 9 is an enlarged partial cross section taken along line 9—9 of FIG. 1.
Figure 10:
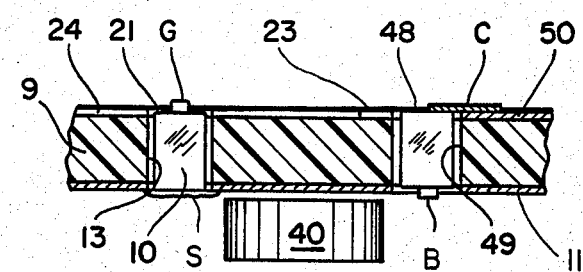
FIG. 10 is an enlarged partial cross section taken along lines 10—10 of FIG. 5.

Reference to FIGS. 9 and 10 shows enlarged partial cross sections of the substrate, depicted in FIGS. 1 and 2 and 5 and 6, respectively, to more clearly illustrate the physical arrangement of the FET and mixer for magnetic coupling to the resonator. In particular in FIG. 9, FET 10 is recessed in an appropriately shaped square hole 13 in the printed circuit board and has its source electrode S soldered to ground plane 11. Also visible in this view is the connection of the gate electrode G of FET 10 to transmission line strip 21. High impedance transmission line strip 24 is shown in the background as is transmission line strip 23. Also illustrated is coupling slot 46 for coupling dielectric resonator 40, which is below and displaced from the ground plane 11 (by means not shown), to output transmission line strip 32 located on the upper side of substrate 9.

In the combined oscillator/mixer arrangement, diode package 48 in the FIG. 8 special configuration is shown disposed in an appropriately-sized square hole 49 through the substrate and ground foil with terminal A illustrated as being coupled to ground plane 11. Terminal C is shown extending over, and being soldered to, transmission line strip 50.

The configuration of the oscillator, with the coupling slots underlying the respective portions of the gate and drain transmission line strips and the dielectric resonator being isolated on the other side of the ground plane make for a very stable arrangement. The further aspect of the invention with the mixer integrated into the oscillator substrate makes for an exceptionally stable and well-performing oscillator/mixer suitable as part of the front end of a direct satellite reception television receiver.

What has been described is a novel high frequency oscillator and a novel high frequency oscillator/mixer combination which are of generally low cost and stable construction. It is recognized that numerous modifications in the described embodiment of the invention will be apparent to those skilled in the art without departing from the true spirit and scope thereof.

I claim:

1. A high frequency oscillator comprising:
   a substrate having opposed top and bottom surfaces;
   a conductive ground plane on said bottom surface;
   a shielded dielectric resonator disposed adjacent to and below said bottom surface;
   transistor means disposed within a hole extending through said substrate and having a common electrode electrically connected to said ground plane, and input and output electrodes;
   first and second transmission line strips on said top surface and electrically connected to said input and output electrodes of said transistor means; and
   first and second series of magnetic field coupling slots, of at least one slot each, formed in said ground plane and disposed for coupling the magnetic field developed by said dielectric resonator to said first and second transmission line strips, respectively, thereby forming a closed feedback loop.

2. The oscillator of claim 1 wherein said first and second transmission line strips extend over said first and second series of magnetic field coupling slots, respectively.

3. The oscillator of claim 2 wherein the lateral dimensions of the coupling slots in said first and second series of magnetic field coupling slots are not substantially greater than the width of the respective first and second overlying transmission line strips.

4. The oscillator of claim 3 wherein said dielectric resonator is cylindrical in shape and wherein said first and second series of magnetic field coupling slots and portions of said first and second transmission line strips generally conform to the circumference of said dielectric resonator.

5. The oscillator of claim 4 further including a third transmission line strip on said top surface;
   a single balanced mixer diode arrangement of a series connected pair of diodes; and
   means mounting said single balanced mixer diode arrangement in an aperture in said substrate and said ground plane in coupled relationship to said dielectric resonator with said diodes being connected to respective locations on said ground plane and the junction between said diodes being connected to said third transmission line strip.

6. The oscillator of claim 4 further including a third transmission line strip disposed on said top surface; and
   means for coupling said third transmission line strip to said dielectric resonator.

7. A high frequency oscillator comprising:
a printed circuit board having a conductive ground plane on one side thereof;
a cylindrical dielectric resonator disposed adjacent to said ground plane;
a gallium arsenide FET disposed within a hole extending through said printed circuit board and having a source electrode connected to said ground plane;
first and second generally arcuate transmission line strips formed on the other side of said printed circuit board and electrically connected to the gate and drain electrodes of said FET;
first and second series of magnetic field coupling slots of at least one coupling slot each formed in said ground plane and disposed with respect to said dielectric resonator and said first and second transmission line strips for coupling electromagnetic energy therebetween; and
said first and second transmission line stripes extending over said first and second series of magnetic field coupling slots, respectively.

8. The oscillator of claim 7 wherein the lateral dimensions of the coupling slots in said first and second series of magnetic field coupling slots are not substantially greater than the width of the respective first and second overlying transmission line strips.

9. An integrated high frequency oscillator/mixer arrangement comprising:
a printed circuit board having a ground plane formed on one side thereof;
a cylindrical dielectric resonator disposed adjacent to said ground plane;
a gallium arsenide FET, disposed within a hole extending through said printed circuit board, having a source electrode electrically connected to said ground plane, and gate and drain electrodes;
first and second arcuate transmission line strips formed on the other side of said printed circuit board and electrically coupled to said gate and drain electrodes;
first and second series of magnetic field coupling slots formed in said ground plane and disposed for magnetically coupling said dielectric resonator to said first and second arcuate transmission line strips respectively; and
a single balanced mixer diode pair disposed in an aperture extending through said printed circuit board and said ground plane, and electrically connected to said ground plane, magnetically coupled to said dielectric resonator for developing a potential difference across said balanced mixer diode pair.

10. The combination of claim 9 wherein said balanced diode mixer comprises a series connected pair of diodes and further including coupling means on the other side of said substrate connected to the junction of said diodes.

* * * * *